United States Patent [19]

Balyasny

[11] Patent Number: 5,415,560
[45] Date of Patent: May 16, 1995

[54] TEST CLIP FOR IC DEVICE

[75] Inventor: Marik Balyasny, Burbank, Calif.

[73] Assignee: ITT Corporation, New York, N.Y.

[21] Appl. No.: 169,835

[22] Filed: Dec. 17, 1993

[51] Int. Cl.[6] ............................................. G01R 31/02
[52] U.S. Cl. .................................. 439/269; 324/755; 439/912
[58] Field of Search ...................... 439/68, 70, 71, 482, 439/912, 264, 269; 324/754, 755, 758, 761, 762

[56] References Cited

U.S. PATENT DOCUMENTS

| | | |
|---|---|---|
| 3,506,949 | 4/1970 | Venaleck et al. . |
| 4,055,806 | 10/1977 | Patel . |
| 4,190,311 | 2/1980 | Basta . |
| 4,508,403 | 4/1985 | Weltman et al. . |
| 4,541,676 | 9/1985 | Hansen et al. . |
| 4,574,235 | 3/1986 | Kelly et al. ........................ 324/158 |
| 4,632,485 | 12/1986 | Brown et al. . |
| 4,735,580 | 4/1988 | Hansen et al. ..................... 439/264 |
| 4,797,118 | 1/1989 | Feamster ............................ 439/264 |
| 4,816,751 | 3/1989 | Seiichi et al. ....................... 324/73 |
| 4,822,295 | 4/1989 | Porter ................................. 439/330 |
| 4,833,404 | 5/1989 | Meyer et al. ....................... 324/761 |
| 4,835,469 | 5/1989 | Jones et al. ........................ 324/755 |
| 4,907,976 | 3/1990 | Killcommons ..................... 439/72 |
| 4,970,460 | 11/1990 | Jensen et al. ...................... 324/158 |
| 4,978,912 | 12/1990 | Vonder et al. . |
| 4,996,476 | 2/1991 | Balyasny et al. .................. 324/754 |
| 5,042,971 | 8/1991 | Ambrose ............................ 439/77 |
| 5,087,877 | 2/1992 | Frentz et al. ...................... 324/158 |
| 5,151,653 | 9/1992 | Yutori et al. ...................... 324/158 |
| 5,156,649 | 10/1992 | Compton et al. .................. 324/762 |
| 5,166,609 | 11/1992 | Cole et al. ......................... 324/158 |
| 5,202,622 | 4/1993 | Cole et al. ......................... 324/761 |
| 5,205,741 | 4/1993 | Steen et al. ........................ 439/70 |

*Primary Examiner*—Neil Abrams
*Attorney, Agent, or Firm*—Thomas L. Peterson

[57] ABSTRACT

A test clip is provided for IC (integrated circuit) devices of the SOP (small outline package) type which effectively positions the clip on the IC device, which facilitates manufacture of test clips for IC devices of different lengths, and which simplifies connection to the contacts of the test clip. The test clip includes a base (44, FIG. 1) with a cavity at its bottom which closely receives the body of the IC device (18), and a pair of arms (46, 48) pivotally mounted on the base and carrying rows of contacts (42). The cavity has opposite side cavity walls (82, 84) that lie adjacent to the sides of the body of the IC device, and end cavity walls (100, FIG. 5) that lie in interference fit with the ends (30) of the body. A group of test clips for IC devices having different numbers of leads at their opposite sides, have identical arms but have bases (44, 44A, FIG. 7) with different size cavities (80, 80A). A pair of flexible flat cables each has a lower end (60b, FIG. 2) connected to the tops of the contacts and an upper end (60u) directly connected to a header (66) that is directly mounted to the top of the base.

5 Claims, 6 Drawing Sheets

TEST CLIP FOR IC DEVICE

BACKGROUND OF THE INVENTION

One type of modern IC (integrated circuit) device is a SOP (small outline package) which has a dielectric body with opposite sides and opposite ends, and a row of leads projected from each of its sides. There are some "standard" lead pitches such as 0.025 inch between the centers of adjacent leads. However, there are a large number of different IC device lengths with corresponding numbers of leads, ranging from 8 to 64 leads per side. A different test clip is required for each of such IC devices, and each test clip must be capable of being accurately aligned and locked to an IC device.

Due to the wide range of body lengths (and even widths) of SOP devices, it would be desirable if the most complicated parts of the test clips, particularly those parts that position and retain the contacts, could be used in IC devices of different lengths. Where the contacts lie on a pivoting arm, a low cost means would be desirable for connecting the moving contacts to a header on the test clip. A test clip which reliably aligned and locked to an IC device of the SOP type, which could be changed to test IC devices of different sizes at minimal cost and with minimal time delay, and which simplified connection of the contacts to a header of the test clip, would be of value.

SUMMARY OF THE INVENTION

In accordance with one embodiment of the present invention, a test clip is described for connection to an IC device of the SOP type, that assures precise positioning of the clip with respect to the leads of the IC device, minimizes the cost and time for constructing test clips for IC devices of different sizes, and simplifies the connection of the contacts to a header on the test clip. The test clip includes a base with a downwardly-opening cavity having side and end cavity walls for closely positioning the test clip with respect to the body of the IC device. Opposite cavity side walls lie adjacent to the upper parts of the body sides, while opposite end cavity walls lie in interference fit with the opposite body ends, at least during installation.

Each test clip frame includes a base that forms the cavity and a pair of arms pivotally mounted on the base with each arm holding a row of contacts. To accommodate IC devices of different lengths, different base are used, but the same arms are used with some contacts or contact positions not being used. A flat flexible cable has a lower end connected to the tops of the contacts, with the upper end of the cable connected to the terminals of a header that is mounted on the base.

DESCRIPTION OF THE PREFERRED EMBODIMENTS

Figure 1:
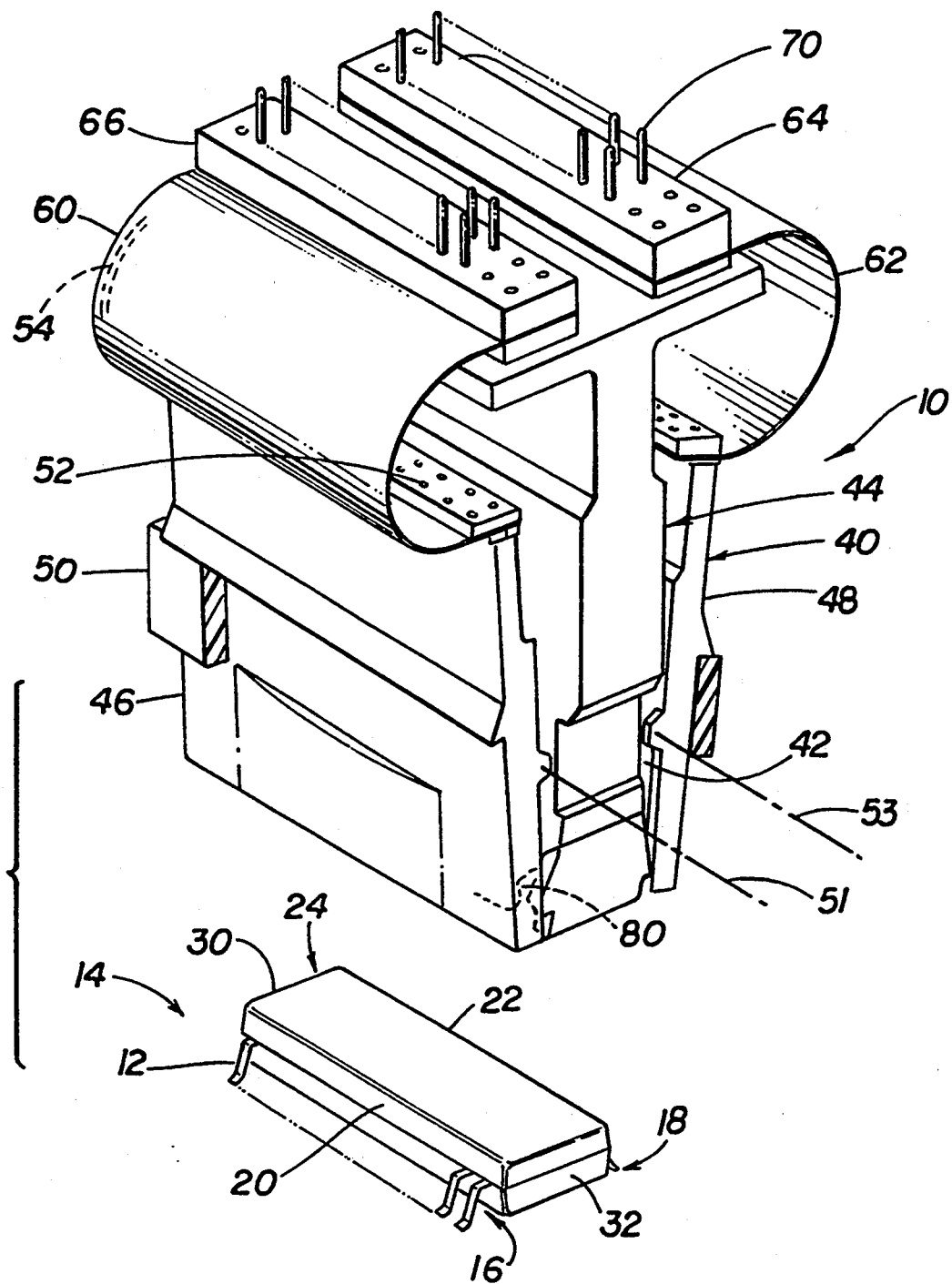
FIG. 1 is an isometric view of a test clip of the present invention, with the lower ends of the arms pivoted together towards an IC-engaging position, and showing the test clip approaching an IC device.

FIG. 1 illustrates a test clip 10 for connecting to the leads 12 of an IC (integrated circuit) device 14. The IC device 14 is a SOP (small outline package) type wherein its leads are arranged in two rows 16, 18 at the opposite sides 20, 22 of the insulative body 24 of the device. The opposite ends 30, 32 of the body are free of leads.

The test clip 10 includes a frame 40 and multiple contacts 42 for engaging the leads of the IC device. The frame includes a base 44 and two arms 46, 48 that are each pivotally mounted on the base about a corresponding pivot axis 51,53. A band 50 surrounds the arms and base to hold them together while allowing the arms to pivot on the base. The contacts 42 are arranged in two rows that are each mounted on a corresponding arm. The contacts have upper ends 52 that are joined to conductors 54 of flexible cables 60, 62. The upper ends of the cables are joined to headers 64, 66, with the cable conductors of the cables connected to corresponding terminals such as pins 70 (sockets can be used instead) of the headers. The headers form connectors that can mate with corresponding connectors 68 (FIG. 2) that extend to test instruments.

Figure 3:
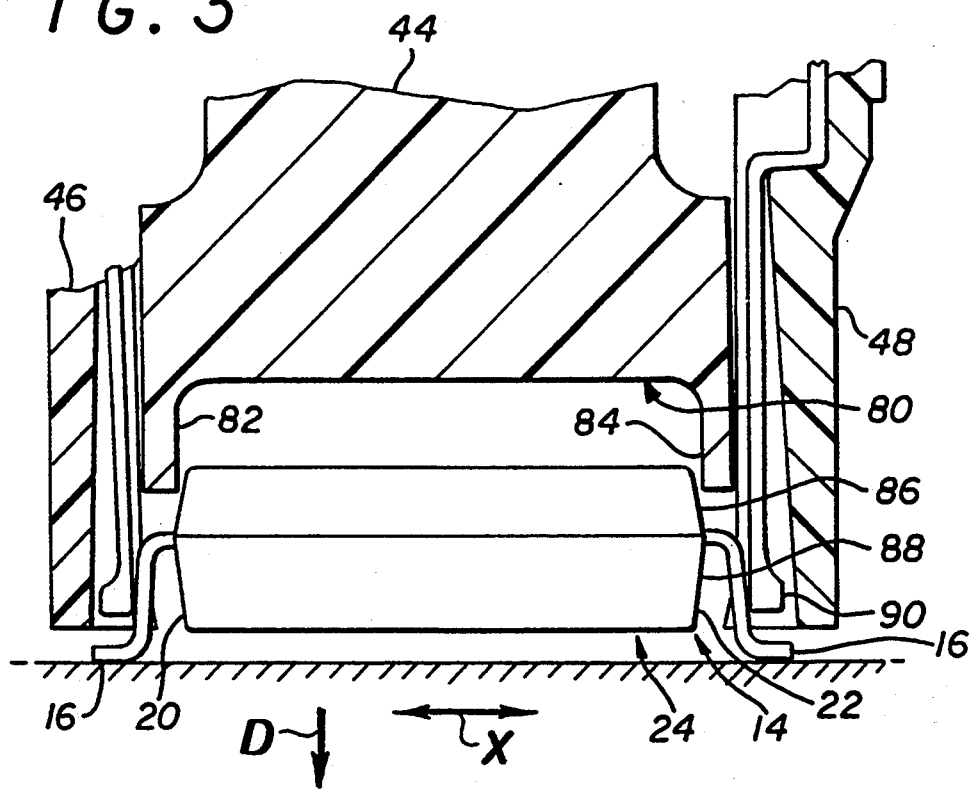
FIG. 3 is a sectional view of a portion of the test clip of FIG. 2, showing the arms in their lead-engaging position.

As shown in FIG. 3, the base 44 of the test clip frame has a lower end that forms a cavity 80 that faces downwardly, in the direction D. The frame has cavity side walls 82, 84 which lie adjacent to opposite sides 20,22 of the IC device body 24 with a gap between at least one cavity side wall and a body side. The opposite sides of the body each have upper and lower parts 86, 88, with the leads 16 projecting from near the intersection of the upper and lower parts. The upper and lower parts are each tapered in opposite directions, as a result of the body molding process. During molding of the body 24, upper and lower mold parts respectively form the upper and lower body parts, with a draft (taper) being required in each mold part to enable release of the body from the mold. The cavity side walls 82, 84 lie adjacent to the upper parts 86 of the side walls to provide moderately accurate alignment in a lateral or sideward direction X with respect to the IC device.

When the arms 46, 48 are pivoted to move the contact lower ends 90 against the leads 16, the test clip will be located precisely enough to assure that all contact lower ends engage corresponding leads. Applicant prefers to use spring 92 (FIG.2) that urges the arms to pivot so their lower ends move toward the IC device. The opposite ends of each arm have body-engaging surfaces 94, 96 that engage the body to limit arm pivoting.

Figure 4:
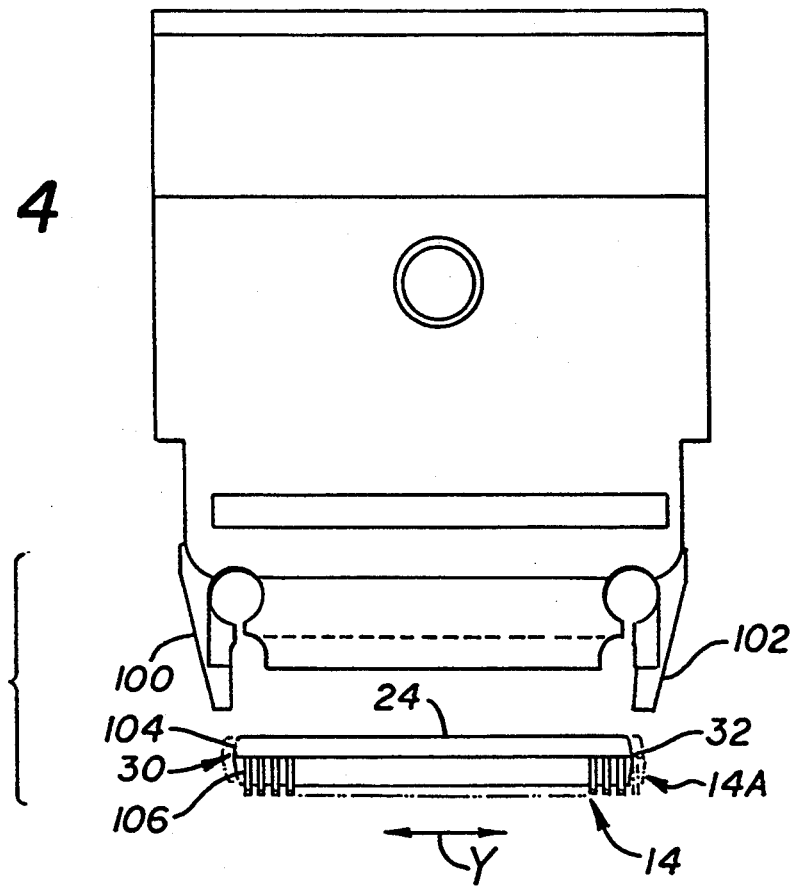
FIG. 4 is a side elevation view of the base of the test clip of FIG. 1, showing it approaching an IC device.

FIG. 4 shows that the cavity has a pair of opposite cavity end walls 100, 102 that are designed to engage opposite ends 30, 32 of the IC device body. Each body end has upper and lower portions 104, 106 that are each tapered as shown, for the same reasons that the opposite sides are tapered. When a person moves the test clip towards the IC device 14, the test clip is positioned so the cavity side and end walls are approximately aligned with the sides and ends of the body of the IC device. The test clip can be moved horizontally in the lateral directions X and in longitudinal directions Y until the person senses that the test clip is vertically aligned with the IC device body. The person then presses down the IC device to approximately its final position. Prior to installing the test clip, the person presses against name plates 110, 112 (FIG. 2) on the opposite arms to pivot them against the force of the spring 92 to keep the lower ends of the contacts out of the way during installation of the clip. After the clip has been fully lowered, the name plates on the arms are released to allow the spring force to pivot the arms so that the contact lower arms engage the leads of the IC device.

Figure 5:
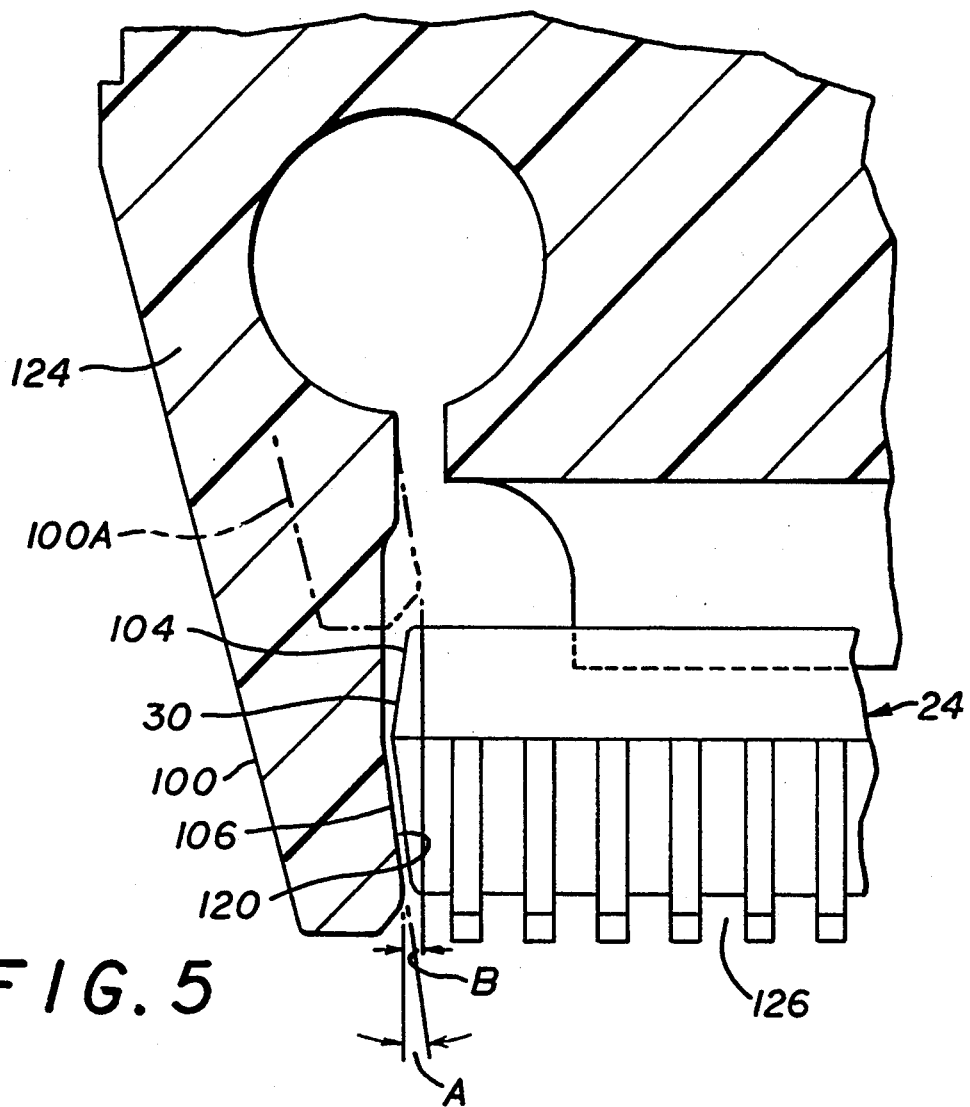
FIG. 5 is an enlarged sectional view of a portion of the base of FIG. 4, showing it engaging the IC device.
Figure 6:
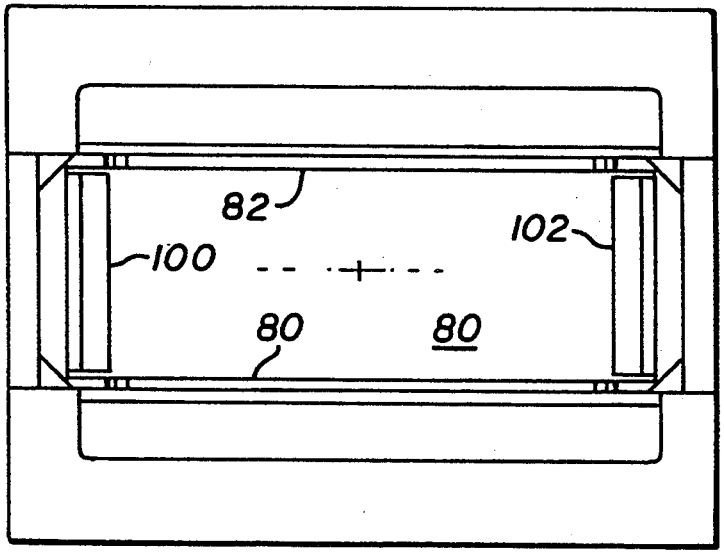
FIG. 6 is a bottom view of the test clip of FIG. 2.

FIG. 5 shows the manner in which each cavity end wall such as 100 engages a corresponding end such as 30 of the IC device body 24. The cavity end wall 100 tends to assume the position 100A prior to encountering the body 24. As the end wall encounters the body, the end wall is longitudinally deflected as it slides downwardly along the upper portion 104 of the body end, until it reaches the intersection of the upper and lower parts 104, 106. In its lowermost position, shown in solid lines in FIG. 5, a lower body end-engaging surface 120 of the cavity end wall engages the lower part 106 of the body end in an interference fit, so that the opposite cavity end walls press against the lower parts of the body ends. Such interference results in the test clip being securely held or locked on the IC device, so the test clip does not fall off and can be removed only by applying a moderate upward force to it.

As mentioned above, the lower part 106 of the body ends are tapered to enable them to be removed from an injection mold. A common mold taper angle is about 7 degrees. Applicant prefers to taper the lower surface 120 of the cavity end wall 100 at an angle A of about 7 degrees. A moderate interference fit is desirable so that it requires a vertical force of about 3 pounds (1.5 kg.) to install or remove the test clip from the IC device. With a coefficient of friction of the cavity wall surface 120 against the body end of about 0.3, this results in the need for sufficient interference fit that the cavity end wall surface 120 presses with a force of about 9 pounds (4 kg.) against the body end. This is achieved with an interference B at each end of about 0.1 mm and a total interference of about 0.2 mm (0.1 mm to 0.4 mm) where the base is formed of an engineering plastic having a Young's modulus of elasticity of about 300,000 psi. It is desirable that the body end-engaging surfaces 120 resiliently separate by about 0.2 mm when a separating force of about 4 kg. (between 1 kg. and 8 kg.) is applied. Suitable material for the base is polyetherimid (UL-TEM), or a liquid crystal polymer material (VEC-TRA). Applicant forms the cavity end wall 100 with a thinned location 124 at its upper end to facilitate bending of the cavity end wall. It can be seen that the length of the end wall below the location 124 is at least 4 times as great as the thickness at 124.

The cavity side and end walls are fixed to each other and to the rest of the stationary portion of the frame. As a result, no pivoting or sliding elements are used to move the cavity end walls 100, 102 against and away from the body ends. This not only simplifies construction and use of the test clip, but results in more precise locating of the cavity end walls. It is noted that the end walls do not "hook" under the bottom 126 of the IC device body. Such hooking could damage the IC device when the test clip was removed. Instead, the cavity walls are moved to their final position, and later removed, merely by pressing down, and later lifting up the test clip (with the arms preferably pivoted apart before moving down the test clip).

Figure 7:
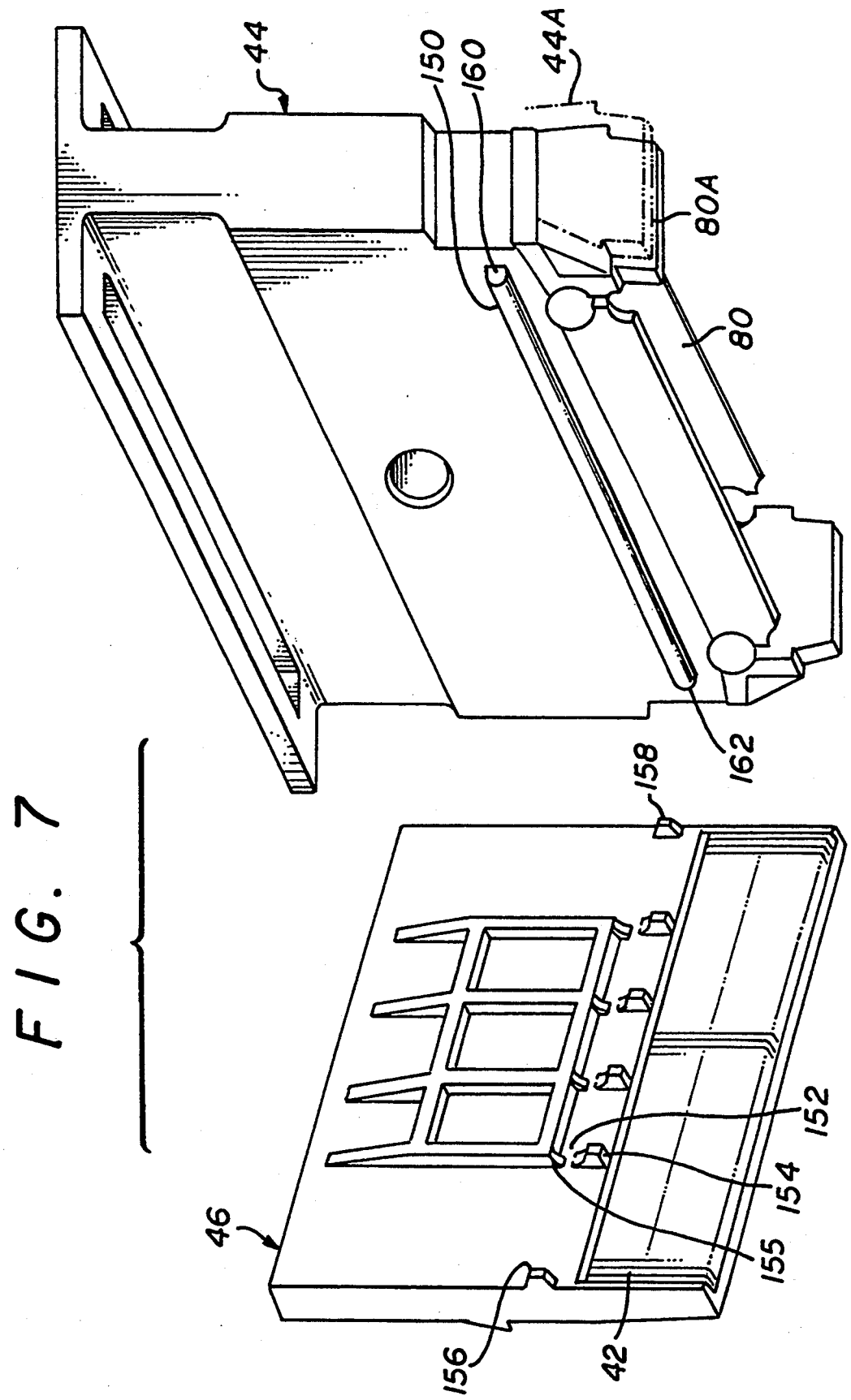
FIG. 7 is an exploded isometric view of the base of the test clip of FIG. 1, and of one of the arms, but without the headers and flexible circuit board.
Figure 8:
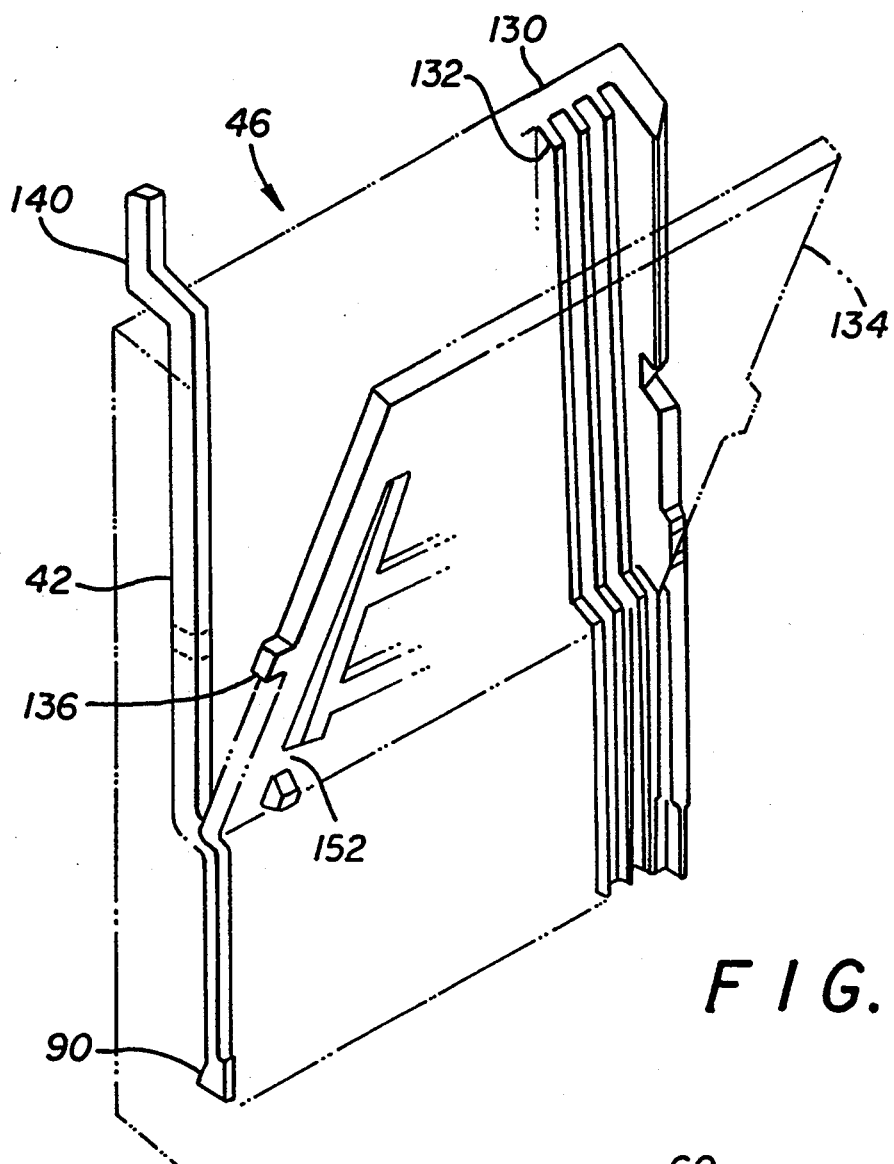
FIG. 8 is an exploded isometric view of one arm of the test clip of FIG. 7, showing the manner of its assembly.

FIG. 8 shows some details of the arm 46 and of the contacts 42. The arm includes a main housing part 130 which has a row of closely space barriers 132, with each contact 42 received between a pair of barriers. A cover 134 covers the upper portions of the contacts to protect them and keep them in place, while leaving the lower ends 90 of the contacts exposed on one side. The cover has tabs 136 that lock it in place on the main housing part, with the upper ends 140 of the contacts projecting above the main housing part and cover. The main housing part 130 and cover 134 are relatively complex devices which are difficult to machine or to fabricate injection mold dies to make them. The base 44 shown in FIG. 7 is less expensive to machine or to make a die for injection molding. As discussed below, applicant is able to use the same arms for different size test clips.

FIG. 7 shows the manner in which the arm 46 is pivotally mounted on one side of the base 44. The base 44 has a pivot bar 150 formed thereon, which receives a pivot recess 152 formed by four sets of projections 154, 155. The arm also has a pair of tabs 156, 158 that are designed to abut opposite ends 160, 162 of the pivot bar.

As discussed earlier, SOP types of IC devices are available in a wide range of lengths with corresponding different numbers of leads, although there are only a limited number of commonly used lead pitches or spacings. FIG. 4 indicates, in phantom lines, another IC device 14A with an additional lead on each side. Although FIG. 7 shows one base 44 with a cavity 80 of predetermined width and length (as measured respectively between the side and end walls), applicant can make a different base indicated at 44A which has a longer cavity 80A. However, the second base 44A has a pivot bar 150 of the same dimensions and length as the pivot bar for the first base 44. As a result, the same arms such as 46 can be mounted on the second base 44A.

The arm 46 is made so the number of contacts 42 is equal to the number of leads on a side of that IC device having the largest number of leads. For IC devices having fewer leads, those contacts 42 near one or both ends of the arm are not utilized. In FIG. 1, three header terminals 70 are missing in each row (two at one end and one at the other end) and six contacts will not be present or used in each header. As a result, the same arms 46 (FIG. 7) can be used for test clips constructed to test IC devices having a range of leads, so long as the leads of all of the IC devices of the group have the same lead pitch (center-to-center spacing). Even the width of the cavity 80 can be varied from one base 44 to another. It is noted that only the lower portions of the different bases 44 vary from one another. The use of the same arms but different bases, enables applicant to more rapidly provide a limited number of new test clips for a new IC device that differs from previous ones. The new IC device may differ by having a different number of leads, or by having a different spacing between each endmost lead and an end of the body, or by having a different width. Such new test clip only requires machining of another base such as 44.

Figure 2:
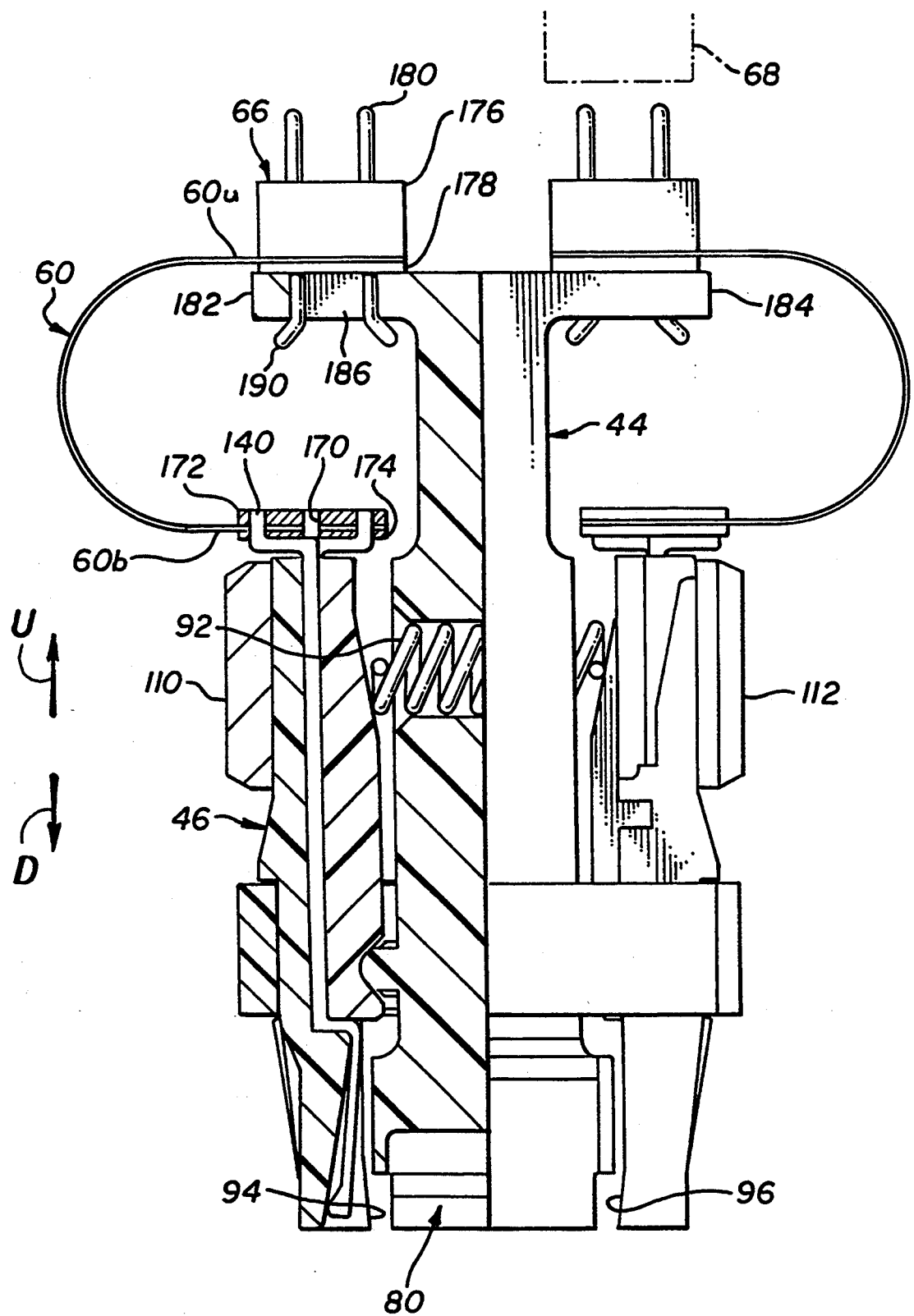
FIG. 2 is a front view of the test clip of FIG. 1, with the arms pivoted partially towards an IC-engaging position, with the left half of the figure being a sectional view and the right half being an elevation view.

FIG. 2 shows that the upper ends of the contacts project through holes 170 of a lower end 60b of the flat flexible cable 60. The flexible flat cable is trapped between a pair of insulative plates 172, 174 mounted at the top of the arm such as 46. Each of the contact upper ends 140 is soldered to a corresponding conductive trace of the flexible flat cable. The upper end 60u of the cable is trapped between an insulative plate 178 and plastic body 176 of the header 66. The header includes two rows of pin terminals 180 that each project through corresponding holes of the plates 176, 178 and which are soldered to the corresponding conductors of the cable. Each of the headers lies on a corresponding wing 182, 184 at the top of the base 44, over a slot 186 in each wing. Each terminal 180 of the header has a lower end 190, with at least some of the header terminal lower ends being bent in opposite directions to lie under a corresponding wing, so as to trap the header 66 on the corresponding wing. This construction avoids the need for the top of the flexible flat cable to connect to traces of a circuit board that, in turn, connect to the pin terminals. The flexible flat cable continues connections during pivoting of the arms, such as 46.

Figure 9:
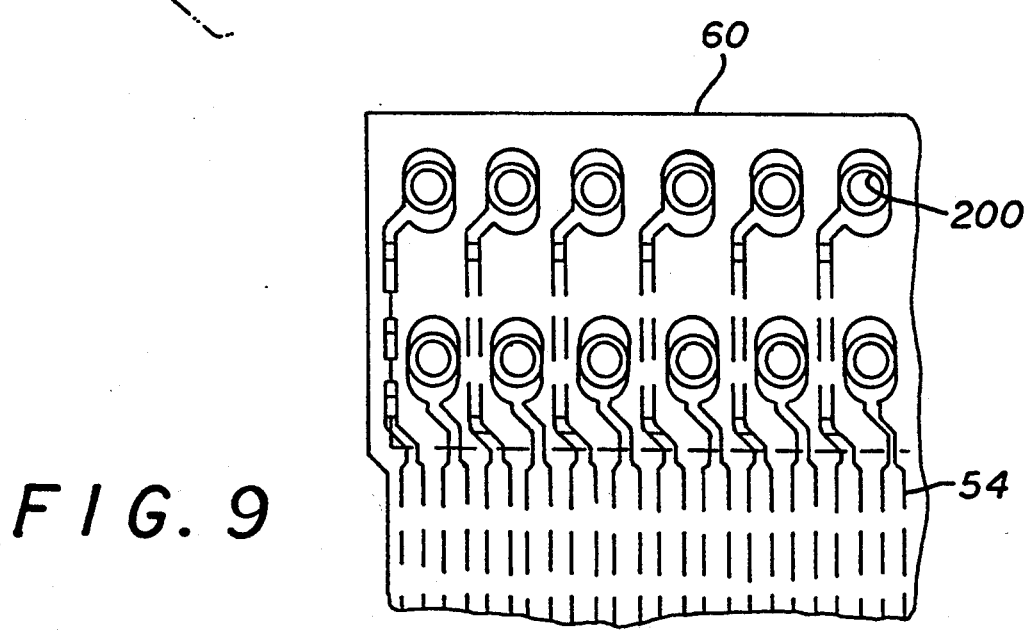
FIG. 9 is a partial plan view of the flat flexible cable of FIG. 1.

FIG. 9 illustrates the construction of an end of the flexible flat cable, showing the holes 200 around the enlarged ends of the cable conductors through which the pins of the terminals extend.

Although terms such as "vertical", "horizontal", etc. are used to aid in describing the test clip as illustrated, it is possible to use the test clip in other orientations with respect to Earth's gravity. The test clip is usually used for temporary connections for testing, but may be used indefinitely for information processing.

Thus, the invention provides a test clip which can be closely aligned with an IC device of the SOP type, and to lock thereto, which facilitates construction of test clips for such IC devices of different size but the same lead pitch, and which simplifies connection of the test clip contacts to a header at the top of the test clip. The test clip includes a base having a lower end forming a cavity with opposite cavity side walls and opposite cavity end walls. The opposite cavity end walls are constructed to lie in interference fit with the opposite ends of the body of the IC device to accurately position and lock the test clip to the IC device. A group of test clips have different bases with different cavities for engaging SOP type IC devices having bodies of different sizes, but with the different test clips having substantially identical contact-holding arms. Flexible flat cables connect the upper ends of the contacts to headers at the top of the test clip. The upper end of each cable is directly connected to a corresponding header, and each header is connected directly to the base of the test clip.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. A plurality of test clips that are each adapted to connect to the leads of a plurality of SOP IC (integrated circuit) devices, wherein first and second of said IC devices each has a body with opposite sides and opposite ends and a row of leads extending from each of said sides, with the spacing of leads of first and second of said IC devices being the same but with said first IC device having a different number of leads in each row than said second IC device, and wherein each of said test clips includes a base having a cavity for initially positioning the test clip on the body and also includes a pair of arms that each has an arm housing pivotally mounted on said base and a row of contacts mounted on the arm housing, wherein said contacts have lower ends for engaging a corresponding row of leads when the arm is pivoted to move the contact lower ends toward the leads, with each base having a pair of pivotal couplings for pivotally supporting a pair of said arms, characterized by:
said base of said first and second test clips have cavities of different lengths but have substantially identical pivotal couplings;
said arms of said first and second test clips have substantially identical arm housings.

2. A test clip for connecting to the leads of an IC (integrated circuit) device that includes a body having opposite sides and opposite ends and that includes a row of leads projecting from each of said sides, wherein the test clip includes a frame with opposite frame sides and a row of contacts with lower lead-engaging ends at each of said frame sides, and wherein said test clip has a frame top that holds at least one header for mating to a connector of an instrument, with said header having terminals each coupled to a different one of said contacts, characterized by:
a flexible flat cable at a first of said frame sides, said cable having lower and upper ends, said cable having a row of conductors with lower conductor ends connected to said contacts and with upper conductor ends directly connected to said terminals of said header.

3. The test clip described in claim 2 wherein:
said header has its terminals arranged in at least two rows with each terminal having a downwardly extending pin portion, and said cable conductor upper ends are arranged in at least two rows with a hole in each cable conductor upper end directly receiving and connected to a corresponding one of said pin portions.

4. The test clip described in claim 2 wherein:
said frame has a vertically extending center with a top, and has a pair of wings projecting in opposite directions from said top;
each of said wings has a slot and at least a portion of said header lies in one of said slots.

5. The test clip described in claim 4 wherein:
said header includes upper and lower insulative plates, with said cable upper end sandwiched between said plates, and with said lower plate lying on top of one of said wings;
a plurality of said pin portion each projects downwardly completely through a corresponding one of said slots and has a lower pin end that is bent sidewardly beneath the corresponding wing to lock the header to the wing.

* * * * *